(12) United States Patent
Li et al.

(10) Patent No.: US 12,555,883 B2
(45) Date of Patent: Feb. 17, 2026

(54) MILLIMETER WAVE CIRCUIT STRUCTURE AND MILLIMETER WAVE MODULE MEASURE EQUIPMENT

(71) Applicant: UNIVERSAL SCIENTIFIC INDUSTRIAL ( SHANGHAI ) CO., LTD., Shanghai (CN)

(72) Inventors: Kuan-Hsing Li, Shanghai (CN); Kuang-Ting Chi, Shanghai (CN)

(73) Assignee: UNIVERSAL SCIENTIFIC INDUSTRIAL ( SHANGHAI ) CO., LTD., Shanghai (CN)

( * ) Notice: Subject to any disclaimer, the term of this patent is extended or adjusted under 35 U.S.C. 154(b) by 140 days.

(21) Appl. No.: 18/604,598

(22) Filed: Mar. 14, 2024

(65) Prior Publication Data

US 2025/0226562 A1 Jul. 10, 2025

(30) Foreign Application Priority Data

Jan. 10, 2024 (CN) .......................... 202410038611.9

(51) Int. Cl.
   *H01P 3/12* (2006.01)
   *G01R 29/08* (2006.01)
   *H05K 9/00* (2006.01)

(52) U.S. Cl.
   CPC .......... *H01P 3/121* (2013.01); *G01R 29/0878* (2013.01); *H05K 9/0081* (2013.01)

(58) Field of Classification Search
   USPC ....................................................... 324/149
   See application file for complete search history.

(56) References Cited

U.S. PATENT DOCUMENTS

2016/0204514 A1* 7/2016 Miraftab ............. H01Q 21/005
343/731

FOREIGN PATENT DOCUMENTS

| CN | 210040492 U | 2/2020 |
|---|---|---|
| CN | 111562443 A | 8/2020 |
| CN | 214225336 U | 9/2021 |
| CN | 114122696 B | 8/2022 |
| CN | 117254230 A | 12/2023 |
| TW | I699038 B | 7/2020 |
| TW | 202201854 A | 1/2022 |

* cited by examiner

*Primary Examiner* — Farhana A Hoque
(74) *Attorney, Agent, or Firm* — Li & Cai Intellectual Property (USA) Office

(57) ABSTRACT

A millimeter wave circuit structure and a millimeter wave module measure equipment are provided, and the millimeter wave circuit structure includes a substrate, two metal through hole groups, a signal feed-in structure, a signal feed-out structure, two slot structures and a metal shielding cover. Each of the metal through hole groups penetrates the substrate. The signal feed-in structure and the signal feed-out structure are provided inside the substrate and located between the two metal through hole groups. The two slot structures are provided on the substrate and respectively connected to the signal feed-in structure and the signal feed-out structure. The metal shielding cover is connected to the substrate and shields the two slot structures.

10 Claims, 11 Drawing Sheets

MILLIMETER WAVE CIRCUIT STRUCTURE AND MILLIMETER WAVE MODULE MEASURE EQUIPMENT

CROSS-REFERENCE TO RELATED PATENT APPLICATION

This application claims the benefit of priority to China Patent Application No. 202410038611.9, filed on Jan. 10, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a millimeter wave circuit structure and a millimeter wave module measure equipment, and more particularly to a millimeter wave circuit structure related to substrate integrated waveguide and a millimeter wave module measure equipment related to substrate integrated waveguide.

BACKGROUND OF THE DISCLOSURE

Products relating to 5G frequency band have emerged in recent years. In addition to the frequency range 1 (FR1) of the millimeter wave band, the frequency range 2 (FR2) is now also utilized. Hence, as the frequency band becomes higher and higher, the problem of high-frequency loss will arise.

In the era of the millimeter wave communication, in order to reduce insertion loss, a rectangular waveguide with low loss and high power characteristics have been developed. Initially, the rectangular waveguide is mostly made of metal materials. However, when the rectangular waveguide integrates with circuits, additional adapter circuits or adapters are required, which causes additional losses and costs.

In view of problems of the rectangular waveguide, a substrate integrated waveguide (SIW) has gradually been used in recent years to reduce the size and cost of the rectangular waveguide. To put it simply, the substrate integrated waveguide has two rows of metal through holes arranged in a substrate, so that electromagnetic waves are restricted in a rectangular cavity formed by the two rows of metal through holes and the upper and lower metal layers of the substrate, thereby realizing the propagation of the magnetic field in the substrate. However, when a signal transmits in the substrate, loss of the signal may occur.

SUMMARY OF THE DISCLOSURE

In response to the above-referenced technical inadequacy, the present disclosure provides a millimeter wave circuit structure and a millimeter wave module measurement device.

In order to solve the above-mentioned problems, one of the technical aspects adopted by the present disclosure is to provide a millimeter wave circuit structure. The millimeter wave circuit structure includes a substrate, two metal through hole groups, a signal feed-in structure, a signal feed-out structure, two slot structures and a metal shielding cover. Each of the metal through hole groups penetrates the substrate, and the signal feed-in structure and the signal feed-out structure are provided inside the substrate and between the two metal through hole groups. The two slot structures are provided on the substrate and are respectively connected to the signal feed-in structure and the signal feed-out structure. The metal shielding cover is connected to the substrate and shields the two slot structures.

In order to solve the above-mentioned problems, another one of the technical aspects adopted by the present disclosure is to provide a millimeter wave module measurement device. The millimeter wave module measurement device includes a measurement carrier board, a jig and a plurality of millimeter wave circuit structures. The jig is connected to the measurement carrier board and is configured to carry a millimeter wave module. The millimeter wave module includes a plurality of signal pins. The plurality of millimeter wave circuit structures are assembled on the measurement carrier board and electrically connected to the plurality of signal pins, respectively. Each of the millimeter wave circuit structures includes a substrate, two metal through hole groups, a signal feed-in structure, a signal feed-out structure, two slot structures and a metal shielding cover. Each of the metal through hole groups penetrates the substrate. The signal feed-in structure and the signal feed-out structure are provided inside the substrate and between the two metal through hole groups. The signal feed-in structure is electrically connected to one of the signal pins correspondingly. The two slot structures are provided on the substrate and are respectively connected to the signal feed-in structure and the signal feed-out structure. The metal shielding cover is connected to the substrate and shields the two slot structures.

Therefore, in the millimeter wave circuit structure and the millimeter wave module measurement device provided by the present disclosure, after an electromagnetic wave signal feeds in the signal feed-in structure, the slot structure and air in the metal shielding cover act as mediums for transmitting the electromagnetic wave signal to the signal feed-out structure. Since the air in the metal shielding cover acts the mediums for transmitting the electromagnetic wave signal, the energy loss of the electromagnetic wave signal is reduced. Moreover, the metal shielding cover also prevents the electromagnetic wave signal from being interfered by external noise, so that the insertion loss of the electromagnetic wave signal and the reflection loss of the electromagnetic wave signal may meet the requirement of the millimeter wave frequency band.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
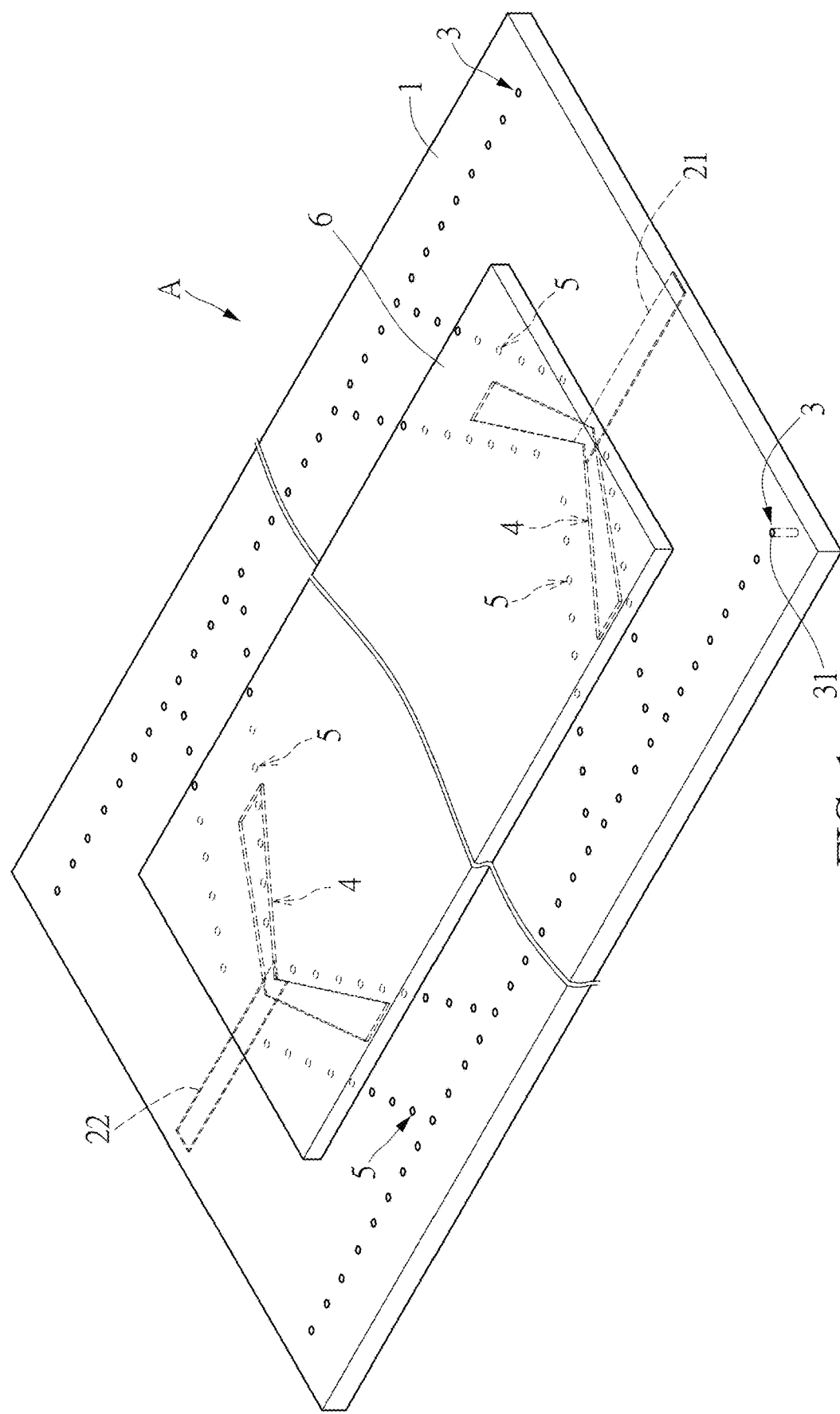
FIG. 1 is a schematic perspective view of a millimeter wave circuit structure according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

FIG. 1 is a schematic perspective view of a millimeter wave circuit structure according to one embodiment of the present disclosure. Referring to FIG. 1, the millimeter wave circuit structure A includes a substrate 1, a signal feed-in structure 21, a signal feed-out structure 22, two first metal through hole groups 3, two slot hole structures 4, two second metal through hole groups 5, and a metal shielding cover 6. Each of the first metal through hole groups 3 penetrates the substrate 1, and the signal feed-in structure 21 and the signal output structure 22 are provided inside the substrate 1 and between the two first metal through-hole groups 3. The two slot structures 4 are provided on the substrate 1 and are respectively connected to the signal feed-in structure 21 and the signal feed-out structure 22 to form a substrate integrated waveguide (SIW). Each of the second metal through hole groups 5 penetrates the substrate 1, and the two second metal through hole groups 5 respectively surround the two slot hole structures 4. The metal shielding cover 6 is connected to a top of the substrate 1 and shields the two slot structures 4.

Figure 2:
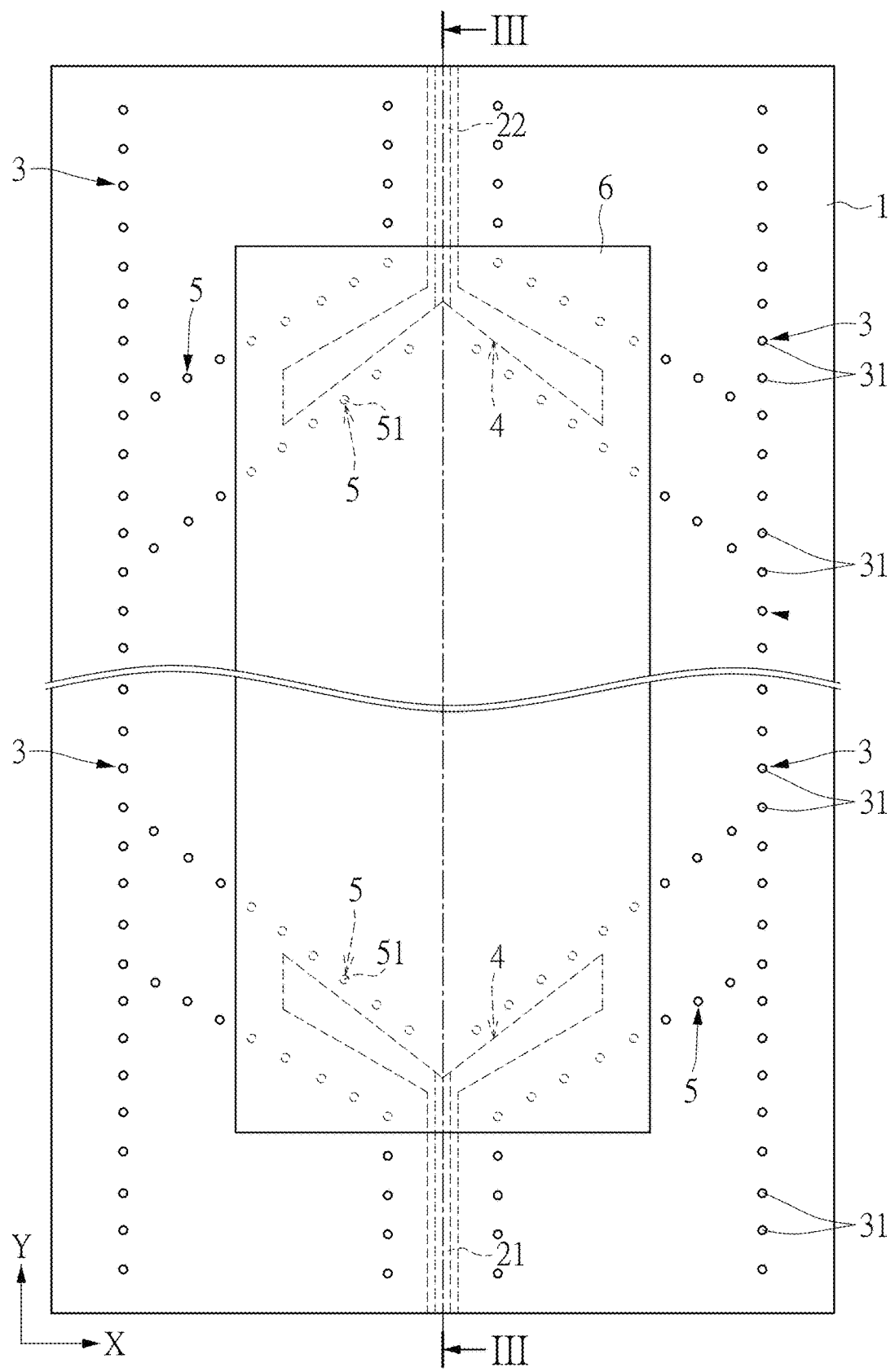
FIG. 2 is a top view of the millimeter wave circuit structure of FIG. 1.
Figure 3:
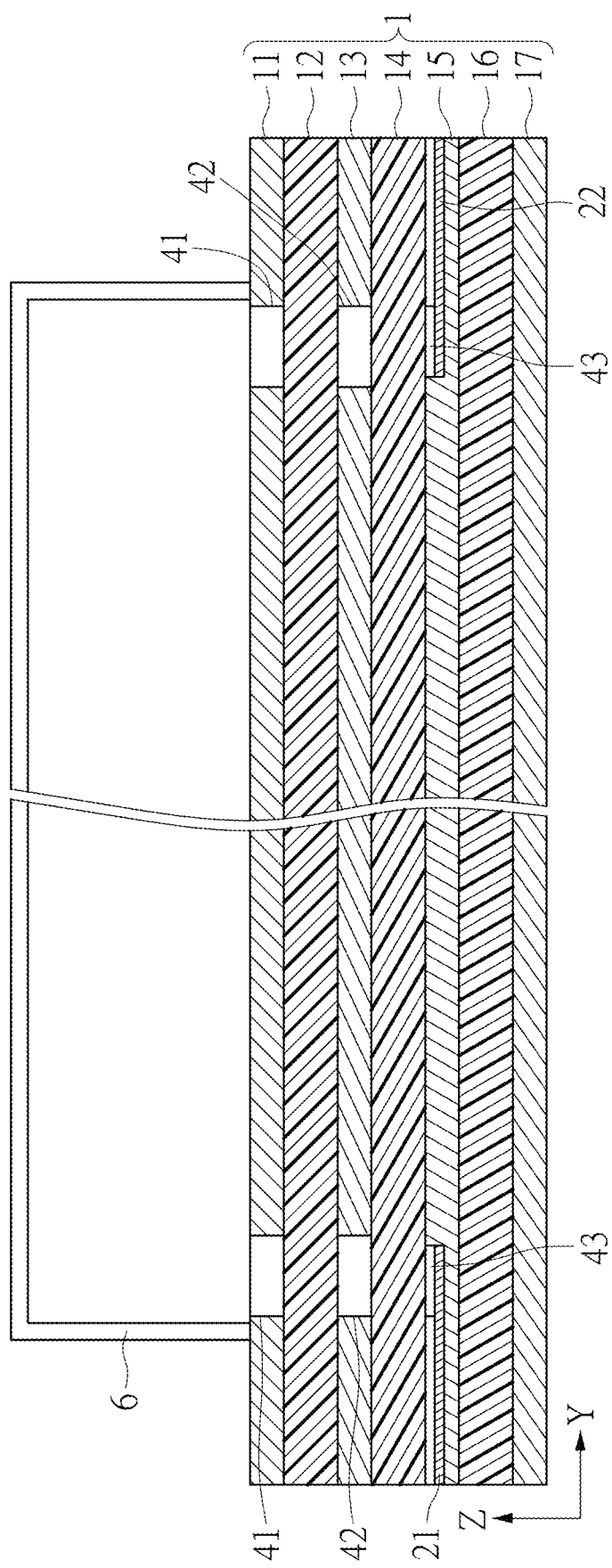
FIG. 3 is schematic cross-sectional view taken along line III-III of FIG. 2.

FIG. 2 is a top view of the millimeter wave circuit structure A of FIG. 1, and FIG. 3 is schematic cross-sectional view taken along line III-III of FIG. 2. Referring to FIGS. 2 and 3, the substrate 1 is, for example, a multi-layer printed circuit board or a flexible circuit board. The substrate 1 includes a top metal layer 11, a first dielectric layer 12, a first inner metal layer 13, and a second dielectric layer 14, a second inner metal layer 15, a third dielectric layer 16 and a bottom metal layer 17. The components of the first dielectric layer 12, the second dielectric layer 14 and the third dielectric layer 16 are insulating materials, such as polyimide or liquid crystal molecular polymer. The components of the top metal layer 11, the first inner metal layer 13, the second inner metal layer 15 and the bottom metal layer 17 are, for example, copper. The first dielectric layer 12 is disposed between the top metal layer 11 and the first inner metal layer 13. The second dielectric layer 14 is disposed between the first inner metal layer 13 and the second inner metal layer 15. The third dielectric layer 16 is disposed between the second inner metal layer 15 and the bottom metal layer 17.

The signal feed-in structure 21 and the signal feed-out structure 22 are, for example, two striplines. The signal feed-in structure 21 and the signal feed-out structure 22 are provided on the second inner metal layer 15 of the substrate 1. Each of the first metal through hole groups 3 includes a plurality of first metal through holes 31, and each of the first metal through holes 31 penetrates the substrate 1 from the top metal layer 11 to the bottom metal layer 17. Each of the second metal through hole groups 5 includes a plurality of second metal through holes 51, and each of the second metal through holes 51 penetrates the substrate 1 from the top metal layer 11 to the bottom metal layer 17. The two slot structures 4 and the two second metal through hole groups 5 are located between the two first metal through hole groups 3. Each of the slot structures 4 includes a Y-shaped opening structure, and the signal feed-in structure 21 and the signal feed-out structure 22 are respectively surrounded by the two Y-shaped opening structures.

Specifically, each of the slot structures 4 includes a first opening structure 41, a second opening structure 42 and a third opening structure 43. The shape of the first opening structure 41 is the same as the shape of the second opening structure 42. The shape of the third opening structure 43 is different from the shape of the first opening structure 41 and the shape of the second opening structure 42. The first opening structure 41 is provided on the top metal layer 11 of the substrate 1. The second opening structure 42 is provided on the first inner metal layer 13 of the substrate 1. The third opening structure 43 is provided on the second inner metal layer 15 and the signal feed-in structure 21 and the signal feed-out structure 22 are respectively located in the two third opening structures 43. Each of the third opening structures 43 has an offset relative to the first opening structure 41 and the second opening structure 42 along a Y-axis direction, and the Y-axis direction is parallel to the top metal layer 11 of the substrate 1.

Figure 4:
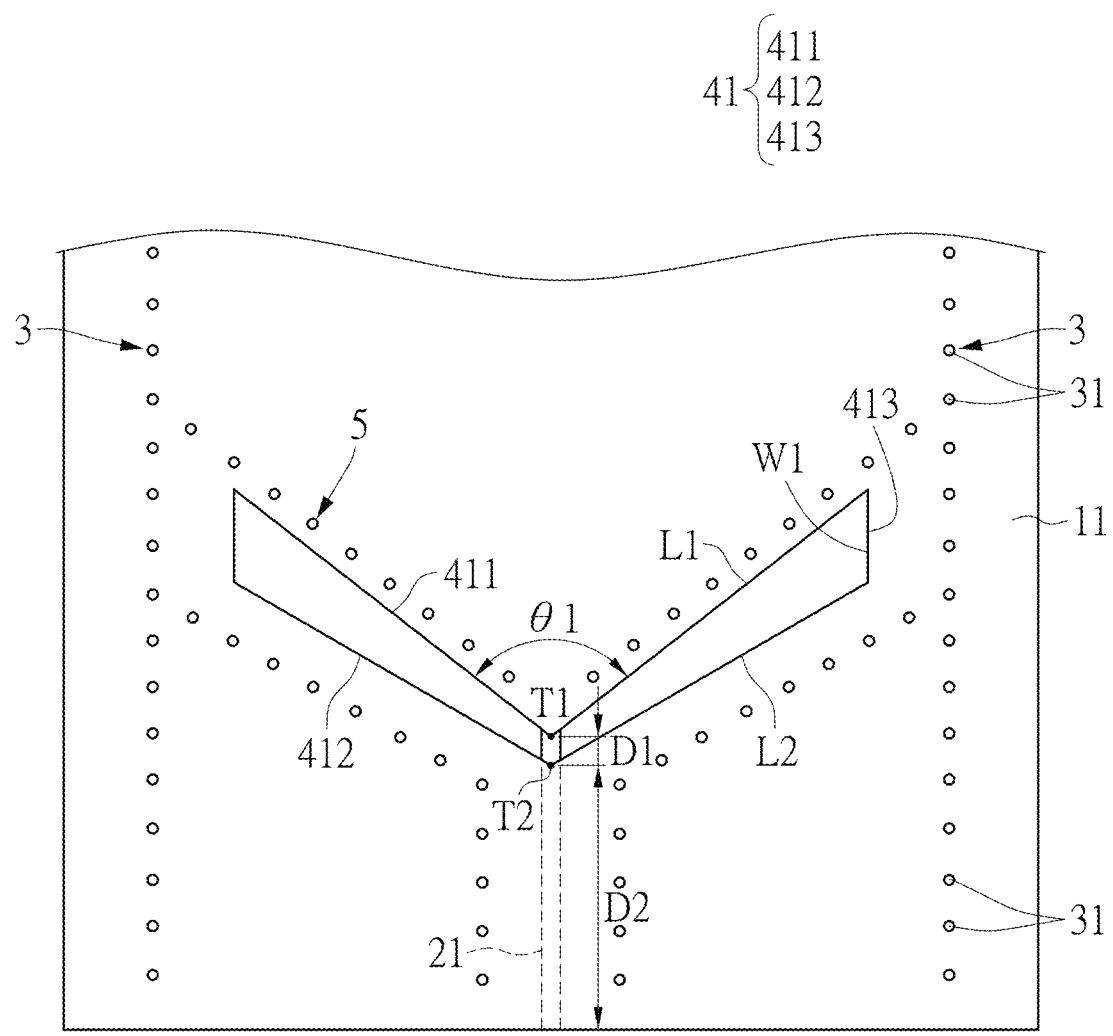
FIG. 4 is a partial schematic top view of a top metal layer of FIG. 3.

FIG. 4 is a partial schematic top view of the top metal layer 11 of FIG. 3. Referring to FIG. 4, each of the first opening structures 41 is approximately V-shaped, and each of the first opening structures 41 includes two opposite upper edges 411, two opposite lower edges 412 and two opposite side edges 413. The two upper edges 411 are connected to each other and located between the two side edges 413. The two lower edges 412 are connected to each other and located between the two side edges 413. A distance between the upper edge 411 and the lower edge 412 of each of the first opening structures 41 gradually becomes narrower along a direction being away from the side edge 413.

The upper edge 411 has a first length L1, and the first length L1 ranges from 1.50 millimeters (mm) to 1.70 millimeters (mm). In this embodiment, the length L1 is 1.65 mm.

The lower edge 412 has a second length L2, and the second length L2 ranges from 1.20 mm to 1.50 mm. In this embodiment, the length L2 is 1.44 mm.

The side edge 413 has a first width W1, and the first width W1 ranges from 0.50 mm to 0.60 mm. In this embodiment, the first width W1 is 0.58 mm.

An intersection of the two upper edges 411 is defined as a first vertex T1, and a place where the two lower edges 412 are connected is defined as a second vertex T2. There is a first distance D1 between the first vertex T1 and the second vertex T2. The first distance D1 ranges from 0.08 mm to 0.20 mm. In this embodiment, the first distance D1 is 0.18 mm. There is a second distance D2 between the second vertex T2 and an edge of the substrate 1, and the second distance D2 ranges from 0.5 mm to 3.0 mm. In this embodiment, the second distance D2 is 1.83 mm. There is a first angle θ1 between the two upper edges 411, and the first angle θ1 ranges from 100 degrees to 110 degrees. In this embodiment, the first angle is 106 degrees.

Figure 5:
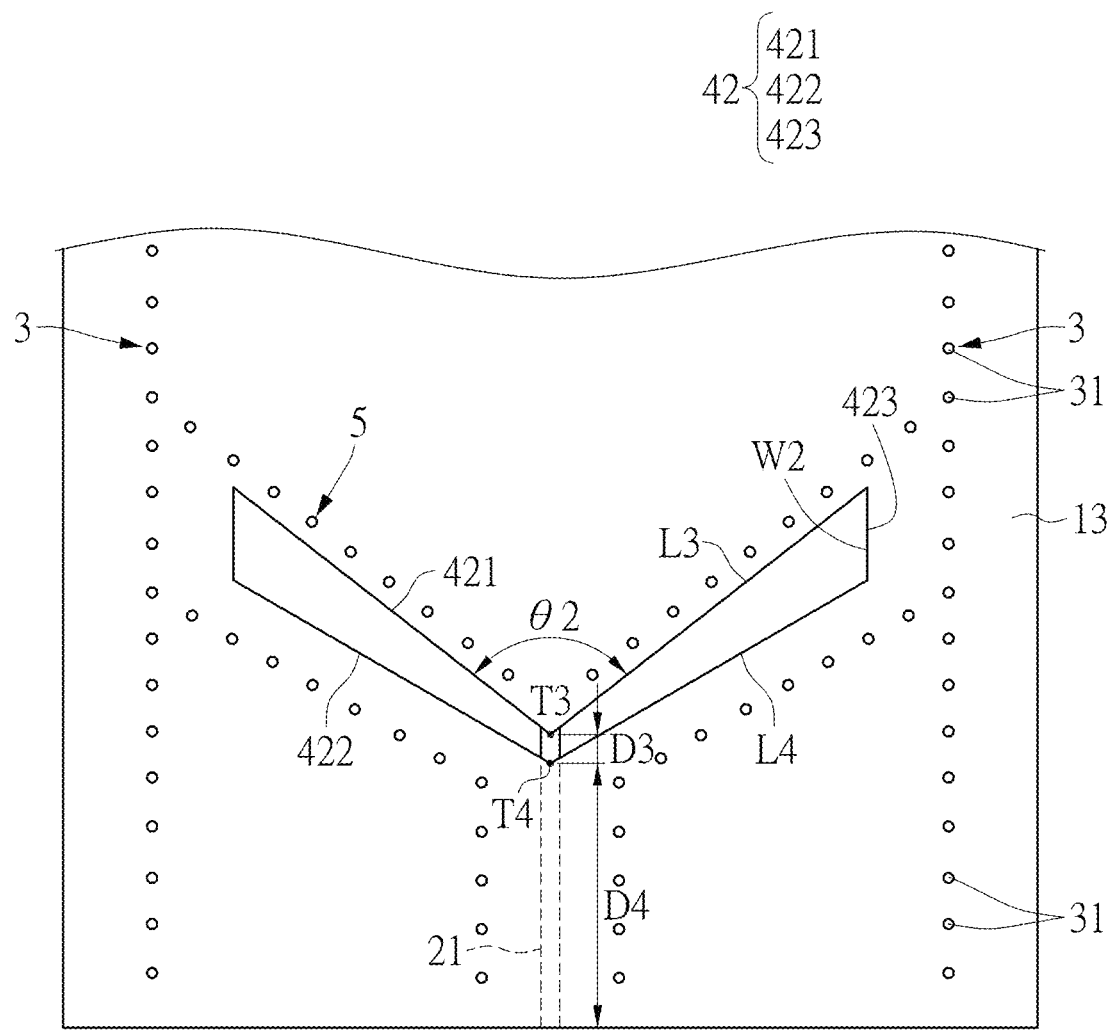
FIG. 5 is a partial schematic top view of a first inner metal layer of FIG. 3.

FIG. 5 is a partial schematic top view of the first inner metal layer 13 of FIG. 3. Referring to FIG. 5, each of the second opening structures 42 is approximately V-shaped, and each of the second opening structures 42 includes two opposite upper edges 421, two opposite lower edges 422 and two opposite side edges 423. The two upper edges 421 are connected to each other and located between the two side edges 423. The two lower edges 422 are connected to each other and located between the two side edges 423. The distance between the upper edge 421 and the lower edge 422 of each of the second opening structure 42 gradually becomes narrower in a direction being away from the side edge 423.

The upper edge 421 has a third length L3, and the third length L3 ranges from 1.50 mm to 1.70 mm. In this embodiment, the third length L3 of the second hole structure 42 is 1.65 mm, and the third length L3 is the same as the first length L1 of the first hole structure 41.

The lower edge 422 has a fourth length L4, and the fourth length L4 ranges from 1.20 mm to 1.50 mm. In this embodiment, the fourth length L4 of the second hole structure 42 is 1.44 mm, and the fourth length L4 is the same as the second length L2 of the first hole structure 41.

The side edge 423 has a second width W2, and the second width W2 ranges from 0.50 mm to 0.60 mm. In this embodiment, the second width W2 of the second hole structure 42 is 0.58 mm, and the second width W2 is the same as the first width W1 of the first hole structure 41.

An intersection of the two upper edges 421 is defined as a third vertex T3. A place where the two lower edges 422 are connected is defined as a fourth vertex T4. There is a third distance D3 between the third vertex T3 and the fourth vertex T4. The third distance D3 ranges from 0.08 mm to 0.20 mm. In this embodiment, the third distance D3 of the second opening structure 42 is 0.18 mm, and the third distance D3 is the same as the first distance D1 of the first opening structure 41.

There is a fourth distance D4 between the fourth vertex T4 and the edge of the substrate 1, and the fourth distance D4 ranges from 0.5 mm to 3.0 mm. In this embodiment, the fourth distance D4 of the second hole structure 42 is 1.83 mm, and the fourth distance D4 is the same as the second separation distance D2 of the first hole structure 41. There is a second angle θ2 between the two upper edges 421, and the second angle θ2 ranges from 100 degrees to 110 degrees. In this embodiment, the second angle θ2 of the two upper edges 421 of the second opening structure 42 is 106 degrees, and the second angle θ2 is the same as the first included angle θ1 of the first opening structure 41.

Figure 6:
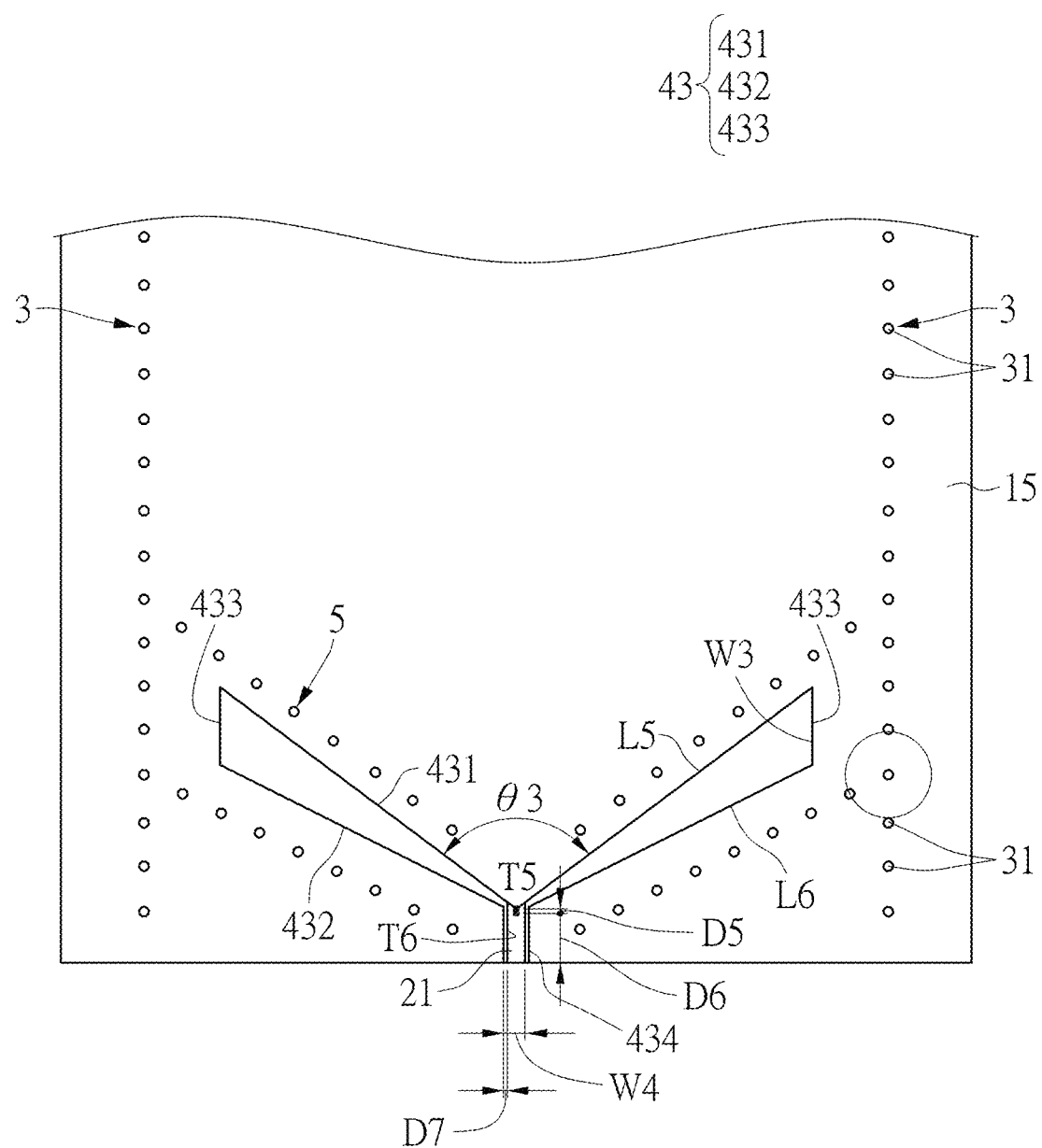
FIG. 6 is a partial schematic top view of a second inner metal layer of FIG. 3.

FIG. 6 is a partial schematic top view of the second inner metal layer 15 of FIG. 3. Referring to FIG. 6, each of the third opening structures 43 is approximately Y-shaped. The signal feed-in structure 21 and the signal feed-out structure 22 (not shown) are respectively surrounded by the two Y-shaped third opening structures 43. Each of the third opening structures 43 includes two opposite upper edges 431, two opposite lower edges 432, two opposite first side edges 433 and two opposite second side edges 434. The two upper edges 431 are connected to each other and located between the two first side edges 433. The two lower edges 432 are located between the two first side edges 433. Two ends of each of the lower edge 432 are connected to the first side edge 433 and the second side edge 434, respectively. A distance between the upper edge 431 and the lower edge 432 of each of the third opening structures 43 gradually becomes narrower along a direction approaching the second side edge 434.

The upper edge 431 has a fifth length L5, and the fifth length L5 ranges from 1.50 mm to 1.70 mm. In this embodiment, the fifth length L5 of the third hole structure 43 is 1.56 mm, and the fifth length L5 is smaller than the first length L1 of the first hole structure 41.

The lower edge 432 has a sixth length L6, and the sixth length L6 ranges from 1.20 mm to 1.50 mm. In this embodiment, the sixth length L6 of the third hole structure 43 is 1.28 mm, and the sixth length L6 is smaller than the second length L2 of the first hole structure 41.

The first side edge 433 has a third width W3, and the third width W3 ranges from 0.50 mm to 0.60 mm. In this embodiment, the third width W3 of the third opening structure 43 is 0.52 mm, and the third width W3 is smaller than the first width W1 of the first opening structure 41.

An intersection of the two upper edges 431 is defined as a fifth vertex T5, an intersection of two extension lines of the two lower edges 432 is defined as a sixth vertex T6, and there is a fifth distance D5 between the fifth vertex T5 and the sixth vertex T6. The fifth distance D5 ranges from 0.08 mm to 0.20 mm. In this embodiment, the fifth distance D5 of the third opening structure 43 is 0.08 mm, and the fifth distance D5 is smaller than the first separation distance D1 of the first opening structure 41.

There is a sixth distance D6 between the sixth vertex T6 and the edge of the substrate 1, and the sixth distance D6 ranges from 0.5 mm to 3.0 mm. In this embodiment, the sixth distance D6 of the third opening structure 43 is 1.74 mm, and the sixth distance D6 is smaller than the second distance D2 of the first opening structure 41. Specifically, there is a distance between the third opening structure 43 and the first opening structure 41, and the distance also exists between the third opening structure 43 and the second opening structure 42. The distance is a difference between the second distance D2 and the sixth distance D6.

There is a third angle θ3 between the two upper edges 431, and the third angle θ3 ranges from 100 degrees to 110 degrees. In this embodiment, the third angle θ3 of the two upper edges 431 of the third opening structure 43 is 108 degrees, and the third angle θ3 is larger than the first angle θ1 of the first opening structure 41. The signal feed-in structure 21 and the signal feed-out structure 22 (not shown) have a fourth width W4, and the fourth width W4 is 0.08 mm. There is a seventh distance D7 between the signal feed-in structure 21 and the second side edge 434 of the third hole structure 43, and the seventh distance D7 also exists between the signal feed-in structure 22 and the second side edge 434 of the third hole structure 43. The seventh distance D7 is 0.075 mm.

Figure 7:
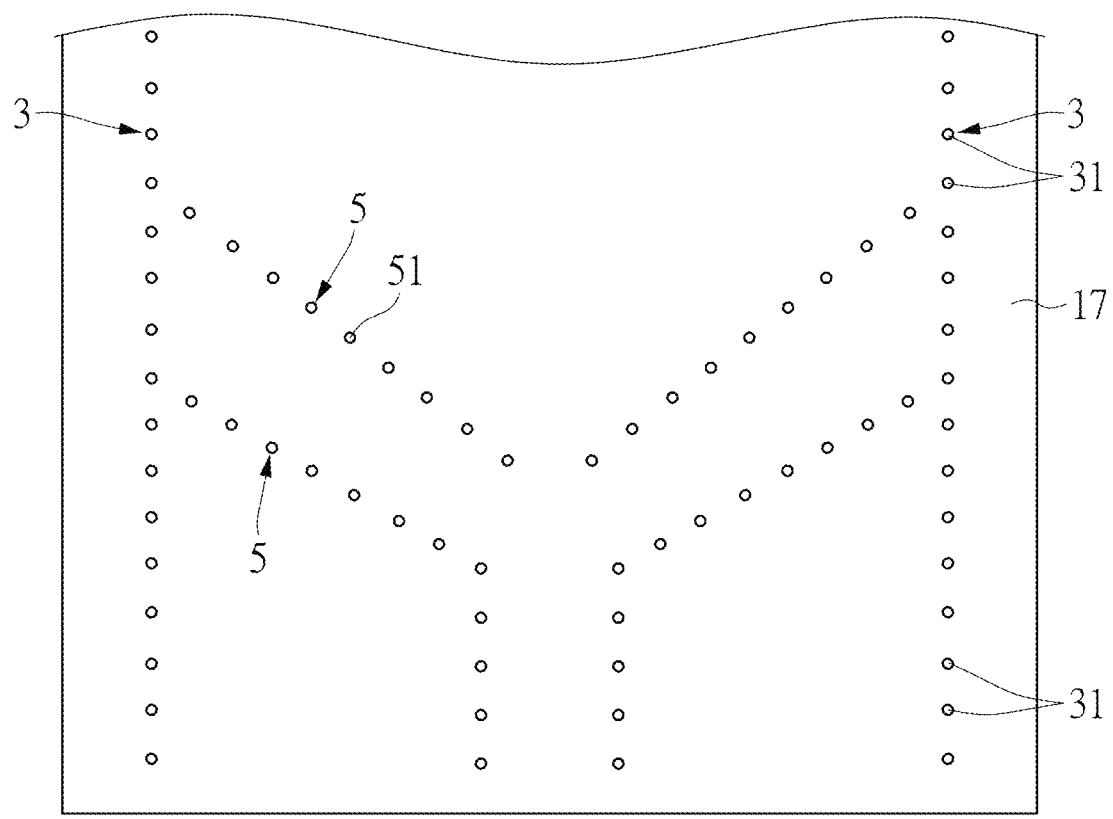
FIG. 7 is a partial schematic top view of a bottom metal layer of FIG. 3.

FIG. 7 is a partial schematic top view of the bottom metal layer 17 of FIG. 3. Referring to FIG. 2 and FIG. 7, the two second metal through hole groups 5 are provided on the substrate 1 and located between the two first metal through hole groups 3. Each of the second metal through hole groups 5 includes a plurality of second metal through holes 51, each of the second metal through holes 51 penetrates the substrate 1 from the top metal layer 11 to the bottom metal layer 17, and the two second metal through hole group 5 surround the two slot structures 4, respectively.

The metal shielding cover 6 is connected to the top metal layer 11 of the substrate 1. For example, the metal shielding cover 6 is fixed on the top metal layer 11 of the substrate 1 via surface adhesion technology. The metal shielding cover 6 covers the two slot structures 4 and is located between the two first metal through hole groups 3.

When an electromagnetic wave signal feeds in the signal feed-in structure 21, the slot structure 4 and air in the metal shielding cover 6 acts as mediums of signal transmission and the electromagnetic wave signal is transmitted to the signal feed-out structure 22 through the slot structure 4 and the air in the metal shielding cover 6. In addition, the metal shielding cover 6 has a certain thickness to prevent the electromagnetic wave signal from being interfered by external noise.

Figure 8:
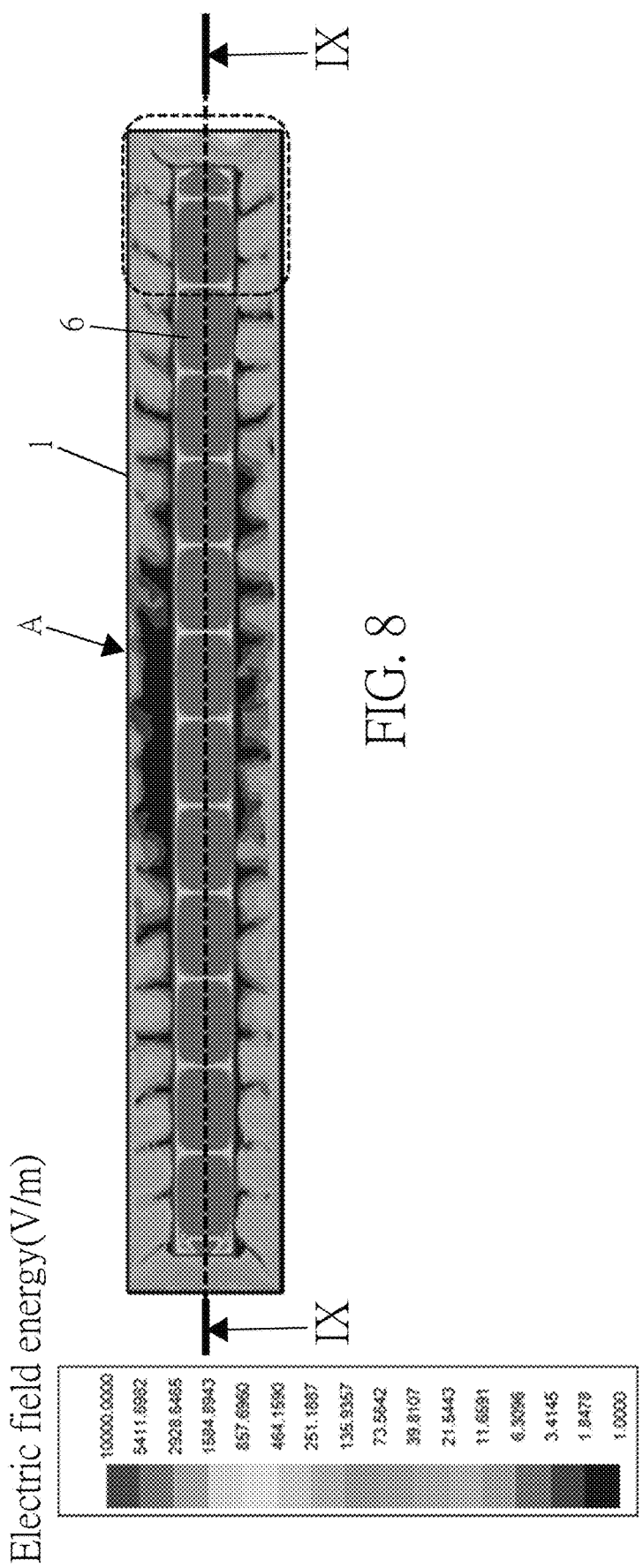
FIG. 8 is a partial schematic top view of electric field energy distribution of the millimeter wave circuit structure of FIG. 1.
Figure 9:
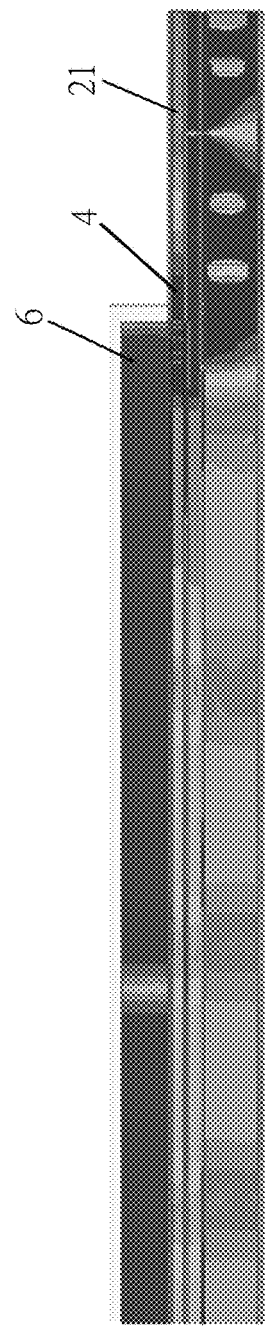
FIG. 9 is schematic cross-sectional view taken along line IX-IX of FIG. 8.

FIG. 8 is a partial schematic top view of electric field energy distribution of the millimeter wave circuit structure A of FIG. 1, and FIG. 9 is schematic cross-sectional view taken along line IX-IX of FIG. 8. As shown in FIGS. 8 and 9, when the electromagnetic wave signal feeds in the signal feed-in structure 21, it is transmitted to the metal shielding cover 6 located on the top of the substrate 1 through the slot structure 4. Then, the electromagnetic wave signal is transmitted to the signal feed-out structure 22 through the air in the metal shielding cover 6 and the other slot structure 4. Since the electromagnetic wave signal is transmitted through the slot structure 4 and the air in the metal shielding cover 6, an energy loss of the electromagnetic wave signal is greatly reduced. Therefore, greater electric field energy is concentrated in the metal shielding cover 6.

Figure 10:
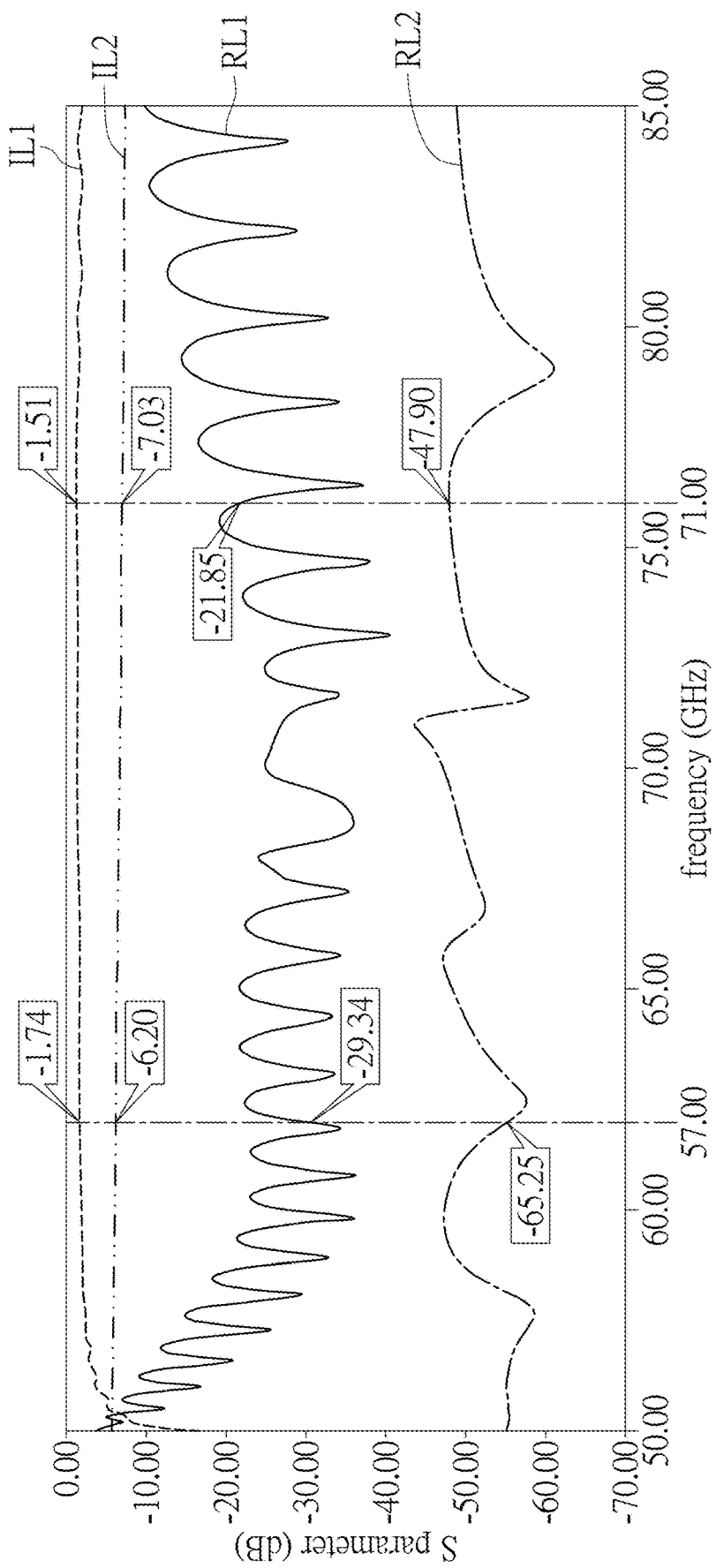
FIG. 10 is a comparison schematic view of insertion loss and reflection loss between the millimeter wave circuit structure of FIG. 1 and a conventional millimeter wave circuit structure.

FIG. 10 is a comparison schematic view of insertion loss and reflection loss between the millimeter wave circuit structure A of FIG. 1 and a conventional millimeter wave circuit structure. For example, the substrate 1 has a length about 60 mm. In the frequency band (57~71 GHz) of the latest frequency range 2 (FR2), a first insertion loss IL1 of the millimeter wave circuit structure A is approximately between-1.51 dB and −1.74 dB, and the first insertion loss IL1 is less than a second insertion loss IL2 of the conventional stripline structure about 5.5 dB. A first reflection loss RL1 of the millimeter wave circuit structure A is approximately between −21.85 dB and −29.34 d B, and a second reflection loss RL2 of the conventional stripline structure is approximately between −47.90 dB and −65.25 dB. The first reflection loss RL1 of the millimeter wave circuit structure A meets the specification below −15 dB, or even below −20 dB, which is suitable for 5G millimeter wave applications.

In the past, the measurement of a millimeter wave module was carried out by transmitting a radio frequency (RF) signal of the millimeter wave module through the stripline of a printed circuit board. However, as shown in FIG. 10, when a transmission distance is 60 mm, the energy loss of the RF signal of the millimeter wave circuit structure A is less than that of the stripline is about 5.5 dB. A length and a width of a test carrier board of a general millimeter wave module measurement device are approximately 40 centimeters respectively. The wiring of the RF signal on the test carrier board must be longer. As a result, when the RF signal is transmitted in a medium of the test carrier board, the energy loss must be greater.

In view of this, the millimeter wave circuit structure of the present disclosure can also be applied to a millimeter wave module measurement equipment to reduce the energy loss of the radio frequency signal.

Figure 11:
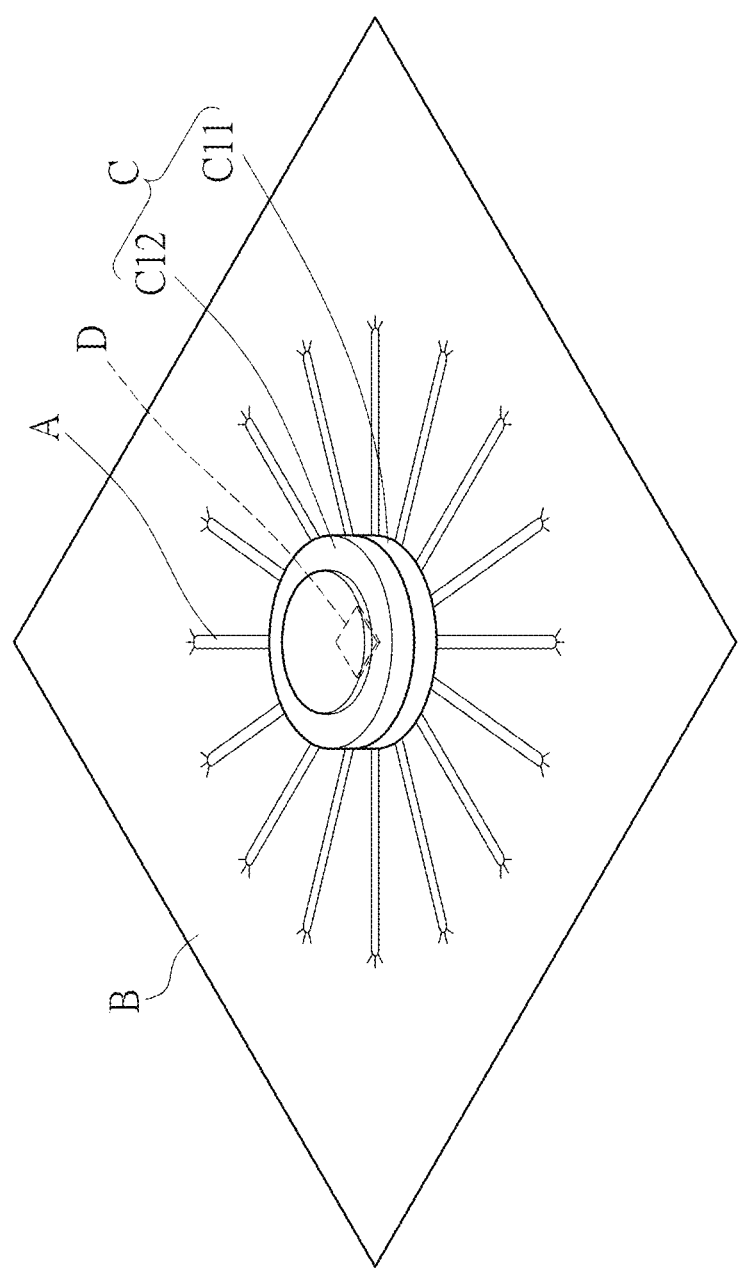
FIG. 11 is a schematic perspective view of a millimeter wave module measurement device according to one embodiment of the present disclosure.

FIG. 11 is a schematic perspective view of the millimeter wave module measurement equipment according to one embodiment of the present disclosure. The millimeter wave module measurement equipment includes a measurement carrier board B, a jig C and a plurality of millimeter wave circuit structures A of FIG. 1. The jig C includes a jig bracket C11 and a jig cover C12. The jig bracket C11 is assembled to the measurement carrier board B and configured to carry a millimeter wave module D. The jig cover C12 is assembled to the jig bracket C11 and shields the millimeter wave module D. The plurality of millimeter wave circuit structures A are connected to the measurement carrier board B.

Figure 12:
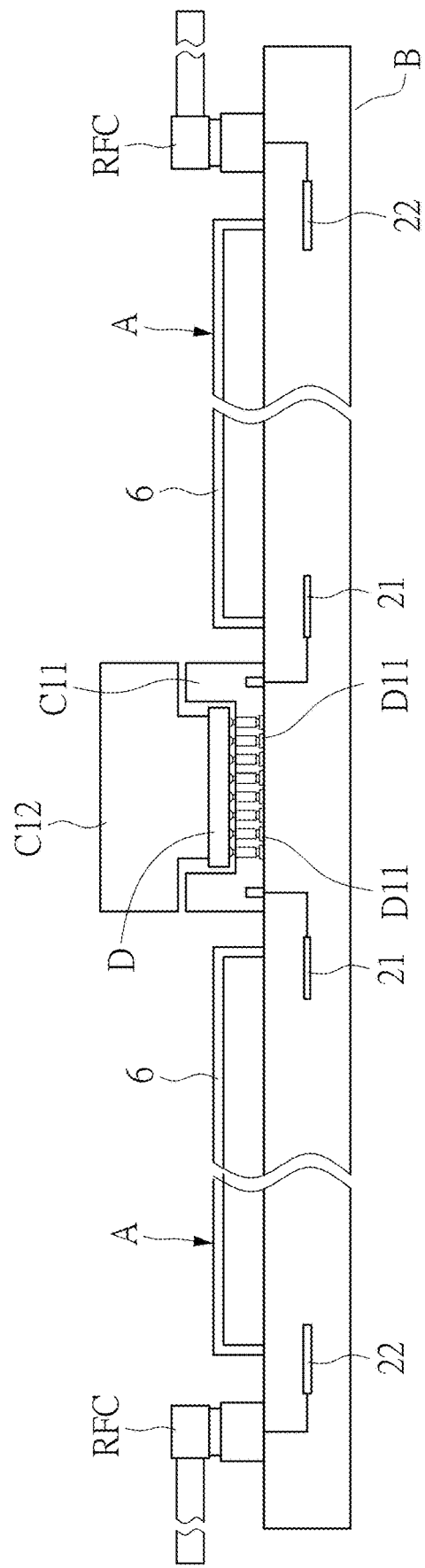
FIG. 12 is a schematic view showing the millimeter wave circuit structure of FIG. 11 is connected to the millimeter wave module.

FIG. 12 is a schematic view showing the millimeter wave circuit structure A of FIG. 11 is connected to the millimeter wave module D. Referring to FIG. 12, the millimeter wave module D includes a plurality of signal pins D11, and the plurality of signal feed-in structures 21 of the plurality of millimeter wave circuit structures A are electrically connected to the plurality of signal pins D11 of the millimeter wave module D through radio frequency traces. In addition, the signal feed-out structure 22 of the millimeter wave circuit structure A can be connected with a radio frequency connector RFC or a GSG pad so that a measuring instrument can measure the plurality of signal pins D11 of the millimeter wave module D.

Beneficial Effects of the Embodiment

In conclusion, in the millimeter wave circuit structure and the millimeter wave module measurement device provided by the present disclosure, after an electromagnetic wave signal feeds in the signal feed-in structure, the slot structure and air in the metal shielding cover act as mediums for transmitting the electromagnetic wave signal to the signal feed-out structure. Since the air in the metal shielding cover acts the mediums for transmitting the electromagnetic wave signal, the energy loss of the electromagnetic wave signal is reduced. Moreover, the metal shielding cover also prevents the electromagnetic wave signal from being interfered by external noise, so the insertion loss of the electromagnetic wave signal and the reflection loss of the electromagnetic wave signal may meet the requirement of the millimeter wave frequency band.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A millimeter wave circuit structure, comprising:
   a substrate;
   two metal through hole groups, each of the metal through hole groups penetrating the substrate;
   a signal feed-in structure provided inside the substrate and between the two metal through hole groups;
   a signal feed-out structure provided inside the substrate and between the two metal through-hole groups;
   two slot structures provided on the substrate and connected to the signal feed-in structure and the signal feed-out structure, respectively; and
   a metal shielding cover connected to a top of the substrate and shielding the two slot structures;
   wherein each of the slot structures includes a plurality of opening structures, each of the opening structures includes two opposite upper edges, two opposite lower edges and two opposite side edges, the two upper edges are connected to each other and located between the two side edges, the two lower edges are connected to each other and located between the two side edges, and a first angle is formed between the two upper edges, and a second angle is formed between the two lower edges.

2. The millimeter wave circuit structure according to claim 1, wherein one of the opening structures is connected to the signal feed-in structure or the signal feed-out structure and has a shape which is different from a shape of each of other ones of the opening structures.

3. The millimeter wave circuit structure according to claim 1, wherein the opening structure connected to the signal feed-in structure or the signal feed-out structure has an offset relative to each of the other ones of the opening structures along a first direction, and the first direction is parallel to a top of the substrate.

4. The millimeter wave circuit structure according to claim 1, wherein the first angle between the two upper edges is smaller than the second angle between the two lower edges.

5. The millimeter wave circuit structure according to claim 1, wherein the first angle between the two upper edges of the opening structure connected to the signal feed-in structure or the signal feed-out structure is greater than other angles of the opening structures.

6. A millimeter wave module measure equipment, comprising:
   a measurement carrier board;
   a jig assembled to the measurement carrier board and being configured to carry a millimeter wave module, the millimeter wave module including a plurality of signal pins;
   a plurality of millimeter wave circuit structures assembled on the measurement carrier board and electrically connected to the plurality of the signal pins, respectively; and
   each of the millimeter wave circuit structures including:
      a substrate;
      two metal through hole groups, each of the metal through hole groups penetrating the substrate;
      a signal feed-in structure provided inside the substrate and between the two metal through hole groups, wherein the signal feed-in structure is electrically connected to one of the signal pins correspondingly;
      a signal feed-out structure provided inside the substrate and between the two metal through hole groups;
      two slot structures provided on the substrate and connected to the signal feed-in structure and the signal feed-out structure, respectively; and
      a metal shielding cover connected to a top of the substrate and shielding the two slot structures;
      wherein each of the slot structures includes a plurality of opening structures, each of the opening structures includes two opposite upper edges, two opposite lower edges and two opposite side edges, the two upper edges are connected to each other and located between the two side edges, the two lower edges are connected to each other and located between the two side edges, and a first angle is formed between the two upper edges, and a second angle is formed between the two lower edges.

7. The millimeter wave module measure equipment according to claim 6, wherein one of the opening structures is connected to the signal feed-in structure or the signal feed-out structure and has a shape which is different from a shape of each of other ones of the opening structures.

8. The millimeter wave module measure equipment according to claim 6, wherein the opening structure connected to the signal feed-in structure or the signal feed-out structure has an offset relative to each of the other ones of the opening structures along a first direction, and the first direction is parallel to a top of the substrate.

9. The millimeter wave module measure equipment according to claim 6, wherein the first angle between the two upper edges is smaller than the second angle between the two lower edges.

10. The millimeter wave module measure equipment according to claim 6, wherein the first angle between the two upper edges of the opening structure connected to the signal feed-in structure or the signal feed-out structure is greater than other angles of the opening structures.

* * * * *